(12) United States Patent
Zhang et al.

(10) Patent No.: US 8,711,620 B2
(45) Date of Patent: Apr. 29, 2014

(54) MEMORY DEVICE HAVING COLLABORATIVE FILTERING TO REDUCE NOISE

(75) Inventors: Fan Zhang, Milpitas, CA (US); AbdelHakim S. Alhussien, Milpitas, CA (US); Zongwang Li, Dublin, CA (US); Erich F. Haratsch, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 137 days.

(21) Appl. No.: 13/588,043

(22) Filed: Aug. 17, 2012

(65) Prior Publication Data
US 2014/0050023 A1 Feb. 20, 2014

(51) Int. Cl.
G11C 11/34 (2006.01)
G11C 16/04 (2006.01)
G11C 16/06 (2006.01)

(52) U.S. Cl.
USPC ............ 365/185.03; 365/185.24; 365/185.02; 365/185.09

(58) Field of Classification Search
CPC ........... G11C 11/5628; G11C 11/5642; G11C 11/5621; G11C 16/0483; G11C 2211/5621
USPC .............. 365/185.02, 189.05, 185.17, 185.18
See application file for complete search history.

(56) References Cited

FOREIGN PATENT DOCUMENTS

WO    WO 2007132458 A2 * 11/2007

* cited by examiner

Primary Examiner — Richard Elms
Assistant Examiner — Ajay Ojha
(74) Attorney, Agent, or Firm — Advent, LLP

(57) ABSTRACT

An apparatus is described that is configured to modify a signal to at least substantially remove a noise portion from the signal. In one or more implementations, the apparatus is a collaborative filtering module that is configured to communicatively couple to a memory array having a plurality of memory cell blocks. The memory array is configured to furnish a signal representative of data stored within the plurality of memory cell blocks. The collaborative filtering module is configured to determine a noise distribution associated with the plurality of memory cell blocks and generate a noise prediction, which is based upon the noise distribution, when a read operation for the plurality of memory cell blocks is issued. The collaborative filtering module is also configured to modify the signal utilizing the noise prediction to at least substantially remove noise from the signal.

20 Claims, 2 Drawing Sheets

MEMORY DEVICE HAVING COLLABORATIVE FILTERING TO REDUCE NOISE

BACKGROUND

Flash memory is a non-volatile computer storage device that can be electrically erased and reprogrammed. Flash memory may include NAND memory devices, NOR memory devices, and the like. Generally, flash memory stores information in an array of memory cells via the use of floating-gate transistors. In an implementation, flash memory may comprise single-level cell (SLC) devices that store only a single bit of information. In another implementation, flash memory may comprise multi-level cell (MLC) devices that can store more than one bit per cell.

SUMMARY

An apparatus is described that is configured to modify a signal to at least substantially remove a noise portion from the signal. In one or more implementations, the apparatus is a collaborative filtering circuit that is configured to communicatively couple to a memory array having a plurality of memory cell blocks. The memory array is configured to furnish a signal representative of data stored within the plurality of memory cell blocks. The collaborative filtering circuit is configured to determine a noise distribution associated with the plurality of memory cell blocks and generate a noise prediction, which is based upon the noise distribution, when a read operation for the plurality of memory cell blocks is issued. The collaborative filtering circuit is also configured to modify the signal utilizing the noise prediction to at least substantially remove noise from the signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

A multi-level memory cell (MLC) can have multiple cell levels in order to store a greater amount of information as compared to single-level cell (SLC) devices. However, multi-level memory cells are prone to noise. Error control utilizing error-correcting code (ECC) processes over a whole block of data (~100,000 bits) is extremely difficult, if not impossible, due to the overwhelming complexity of the memory architecture. It is contemplated that collaborative filtering techniques may be utilized to de-noise blocks of data, as described in greater detail below. It is contemplated that collaborative filtering (CF) deals with very large data sets with sub-linear (e.g., size of the data set) complexity.

Figure 1:
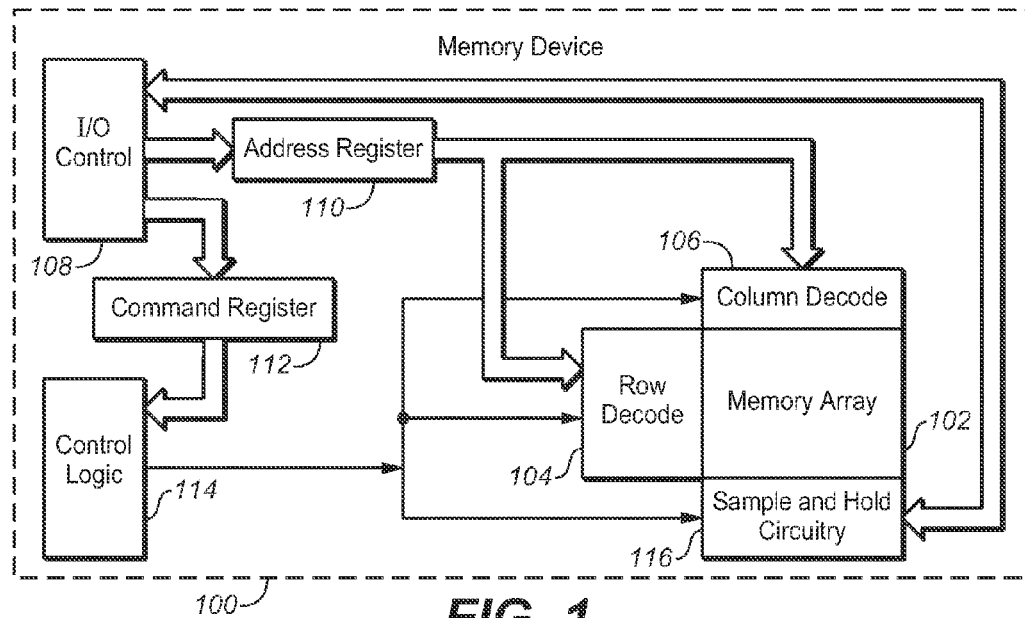
FIG. 1 is a block diagram of a memory device according to an example implementation of the present disclosure.

FIG. 1 illustrates a memory core architecture that comprises a memory device 100 in accordance with example implementations of the present disclosure. As shown, the memory device 100 includes an array 102 of memory cells (see FIG. 2) arranged in rows and columns (e.g., each memory cell comprises a NAND device at the intersection of the bitlines and wordlines, as described below). Although the various embodiments will be described primarily with reference to NAND memory arrays, the various implementations are not limited to a specific architecture of the memory array 102. Some examples of other array architectures suitable for the present implementations include NOR arrays, AND arrays, and so forth. However, the implementations described herein may be adaptable to any array architecture permitting generation of a data signal indicative of the threshold voltage of each memory cell.

As shown in FIG. 1, row decode circuitry 104 and column decode circuitry 106 are provided to decode address signals provided to the memory device 100. Address signals are received and decoded to access the memory array 102 (e.g., access one or more blocks of memory cells). The memory device 100 also includes input/output (I/O) control circuitry 108 to manage input of commands, addresses, and data to the memory device 100, as well as output of data from the memory device 100. An address register 110 may be communicatively connected between the I/O control circuitry 108 and the row decode circuitry 104 and the column decode circuitry 106 to latch the address signals prior to decoding. A command register 112 is coupled between the I/O control circuitry 108 and the control logic 114 to latch incoming commands. The control logic 114 represents functionality to control access to the memory array 102 in response to the commands and generates status information for a processor. The control logic 114 is communicatively connected to the row decode circuitry 104 and the column decode circuitry 106 to control the row decode circuitry 104 and the column decode circuitry 106 in response to the address signals.

The control logic 114 is also connected to sample and hold circuitry 116. The sample and hold circuitry 116 is configured to latch data (e.g., latch incoming or outgoing data) as analog voltage levels. For instance, the sample and hold circuitry 116 may include capacitors, or other analog storage devices, for sampling either an incoming voltage signal representing data to be written to a memory cell or an outgoing voltage signal indicative of the threshold voltage sensed from a memory cell. The sample and hold circuitry 116 may further provide for amplification and/or buffering of the sampled voltage to provide a stronger data signal to an external device.

During a write operation, target memory cells of the memory array 102 are programmed until voltages indicative of the respective memory cell's Vt levels match the levels held in the sample and hold circuitry 116. In an implementation, this can be accomplished using differential sensing devices to compare the held voltage level to a threshold voltage of the target memory cell. For example, programming pulses could be applied to a target memory cell to increase the memory cell's threshold voltage until reaching or exceeding the desired value. In a read operation, the Vt levels of the target memory cells are passed to the sample and hold circuitry 116 for transfer to an external processor either directly as analog signals or as digitized representations of the analog signals (depending upon whether analog-to-digital/digital-to-analog [ADC/DAC] functionality is provided external to, or within, the memory device).

Threshold voltages of cells may be determined in a variety of manners. For example, a word line voltage may be sampled at the point when the target memory cell is activated. In another example, a boosted voltage could be applied to a first source/drain side of the target memory cell, and the threshold voltage may be taken as a difference between the target memory cell's control gate voltage and the voltage at the target memory cell's other source/drain side. By connecting the voltage to a capacitor, charge may be shared with the capacitor to store the sampled voltage. It is understood that the sampled voltage need not be equal to the threshold voltage, but indicative of that voltage. For instance, in the case of applying a boosted voltage to a first source/drain side of the memory cell and a known voltage to the memory cell's control gate, the voltage developed at the second source/drain side of the memory cell may be taken as the data signal as the developed voltage is indicative of the threshold voltage of the memory cell.

Figure 2:
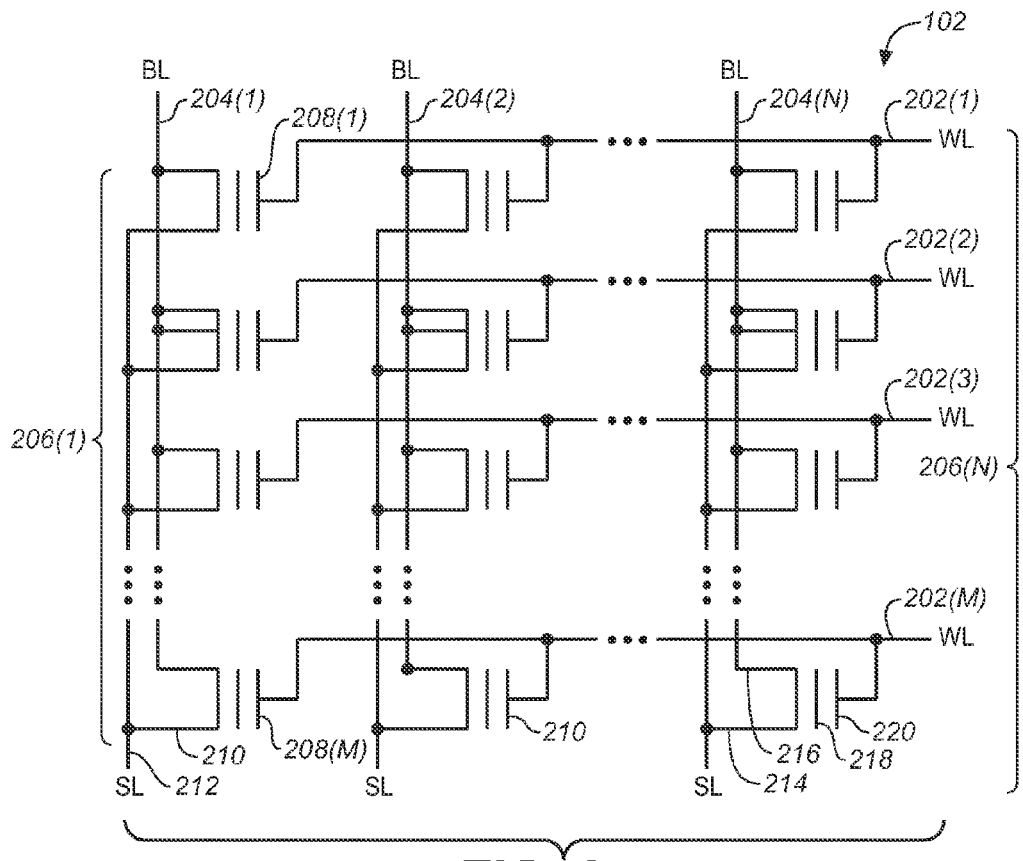
FIG. 2 is a schematic diagram of a portion of an example NAND memory array, such as the NAND memory array included in the memory device of FIG. 1.

FIG. 2 illustrates an example portion of a memory array 102 shown in FIG. 1. As shown, the memory array 102 includes word lines (WL) 202(1) to 202(M) and intersecting bit lines (BL) 204(1) to 204(N). The memory array 102 also includes NAND strings 206(1) to 206(N). Each NAND string includes transistors 208(1) to 208(N), which are located at an intersection of a respective word line 202 and a respective bit line 204. The transistors 208 (e.g., shown as floating-gate transistors in FIG. 2) represent non-volatile memory cells 210 for storage of data. In an implementation, a source of each transistor 208 (memory cell 210) is connected to a source line 212. The drain of each transistor 208 is connected to a local bit line 204 for the corresponding NAND string at a drain contact. For example, the drain of transistor 208(1) is connected to the local bit line 204(1) for the corresponding NAND string 206(1) at a drain contact.

The floating-gate transistors 208 include a source 214, a drain 216, a floating gate 218, and a control gate 220, as shown in FIG. 2. Floating-gate transistors 208 have the respective control gates 220 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized, including, but not limited to: NROM, magnetic, ferroelectric transistors and other transistors capable of being programmed to assume one of two or more threshold voltage ranges. In an implementation, the memory cell 210 may comprise a multi-level cell (MLC). A multi-level cell is a memory cell capable of storing more than a single bit of information (e.g., data).

Figure 3:
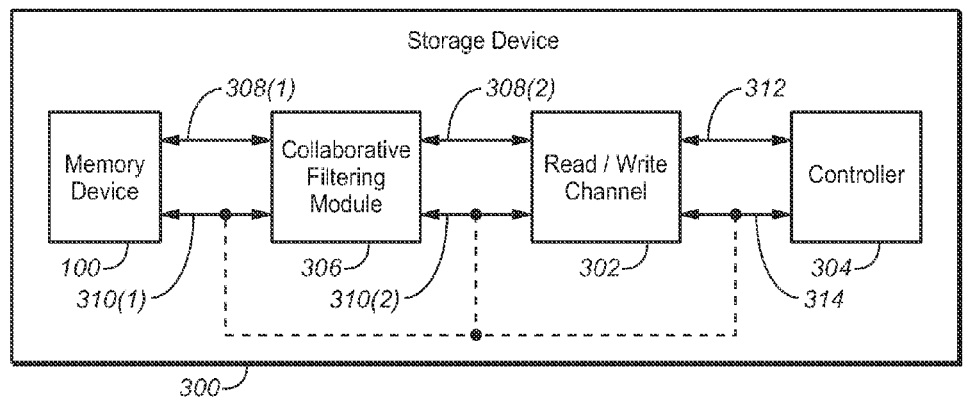
FIG. 3 is a block schematic diagram of a storage device in accordance with an example implementation of the present disclosure.

FIG. 3 illustrates a storage device 300 in accordance with an implementation of the present disclosure. As shown, the storage device 300 includes memory device 100, a read/write channel 302, a controller 304, and a collaborative filtering module 306. The read/write channel 302 provides for analog-to-digital conversion of data signals received from the memory array 102 as well as digital-to-analog conversion of data signals received from a controller 304. The controller 304 may provide for communication between a bulk storage device and an external processor through a bus interface.

The memory device 100 is communicatively connected to a collaborative filtering module 306 by way of an analog interface 308(1) and/or a digital interface 310(1). The collaborative filtering module 306 is communicatively connected to the read/write channel 302 via an analog interface 308(2) and a digital interface 310(2). The analog interfaces 308 provide for the passage of analog data signals between the respective devices while the digital interfaces 310 provides for the passage of control signals, command signals and address signals between the respective devices. The analog interfaces 308 and the digital interfaces 310 may share signal lines as noted with respect to the memory array 102. Although the implementation of FIG. 3 depicts dual analog/digital interfaces to the memory device, functionality of the read/write channel 302 could optionally be incorporated into the memory array 104 as discussed with respect to FIG. 1 such that the memory array 104 communicates directly with the controller 304 using only a digital interface for passage of control signals, command signals, status signals, address signals and data signals.

The read/write channel 302 is coupled to the controller 304 through one or more interfaces, such as a data interface 312 and a control interface 314. The data interface 312 provides for the passage of digital data signals between the read/write channel 302 and the controller 304. The control interface 314 provides for the passage of control signals, command signals, and address signals from the controller 304 to the read/write channel 302. The control interface 314 may further provide for the passage of status signals from the read/write channel 302 to the controller 304. Status and command/control signals may also be passed directly between the controller 304 and the collaborative filtering module 306 (as well as the memory array 104) as depicted by the dashed line connecting the control interface 314 to the digital interface 310.

The read/write channel 302 is a signal processor configured to at least provide for conversion of a digital data stream (e.g., digital signal) to an analog data stream (e.g., analog signal) and vice versa. Thus, the read/write channel 302, in an implementation, is configured to convert a signal from a first data stream to a second data stream, and vice versa. A digital data stream provides data signals in the form of binary voltage levels, i.e., a first voltage level indicative of a bit having a first binary data value (e.g., 0) and a second voltage level indicative of a bit having a second binary data value (e.g., 1). An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

For read requests, the controller 304 is configured to pass command and address signals to the read/write channel 302. In an implementation, the controller 304 is configured to pass command and address signals for requesting a block (e.g., a word line, etc.) of data to the memory array 104. In response, after performing the read operation, the memory array 104 returns analog data signals indicative of the threshold voltages of the memory cells 210 defined by the address signals and the read command (e.g., the memory cells 210 within the block). The memory array 104 may transfer its analog data signals in parallel or serial fashion.

As described above, the storage device 300 also includes the collaborative filtering module 306, which is representative of furnishing collaborative filtering functionality for the storage device 300. For example, the collaborative filtering module 306 may execute one or more software programs that implement collaborative filtering techniques described herein. In an implementation, the collaborative filtering module 306 comprises circuitry configured to process and to store data as described herein. Generally, the collaborative filtering module 306 is representative of a processor to filter for information or patterns through techniques involving collaboration among multiple data sources (e.g., blocks of memory cells 210), and so forth. More specifically, the collaborative filtering module 306 is representative of functionality to generate a noise prediction (e.g., a noise probability distribution value associated with one or more blocks of memory cells 210 as described below) and compensate (e.g., modify) an output signal from the memory array 104 by at least substantially removing the noise from the output signal (e.g., signal indicative of the stored data in the corresponding memory cell block). For example, the noise prediction may represent a value, such as the noise distribution value, for which the output signal is to be modified by. Thus, the noise prediction may represent the approximate noise detected by the read/write channel 302, as described in greater detail below. The storage device 300 may also be configured to utilize the noise prediction to determine whether the output signal is at least substantially noise free, to predict the value of a signal from a memory cell 210, and so forth.

In an implementation, the collaborative filtering module 306 is configured to generate a noise probability distribution (e.g., values representing a noise associated with) one or more blocks of memory cells 210 within the memory array 102. In some implementations, a block may correspond to at least substantially all of the memory cells 210 that are coupled to a single word line 204. For example, the collaborative filtering module 306 may be configured to generate (e.g., calculate, etc.) a noise probability (e.g., a noise value) for at least a portion of the blocks of memory cells 210 within the array 102 based upon one or more previous successful reads of the respective blocks of memory cells 210. For instance, the collaborative filtering module 306 is configured to generate a noise probability distribution for one or more blocks of memory cells 210 within the array 102 to represent noise values associated with each successfully read block of memory cells 210. The noise probability distribution may be modeled by:

$$Pb=[Pb(w0), Pb(w1), \ldots, Pb(wM)] \quad \text{EQ. 1,}$$

where Pb(wM) represents the noise distribution value associated with each respective block (e.g., word line 206(M)) of memory cells 210. It is understood that the noise distribution associated with each block of memory cells 210 may be generated in a number of ways. For example, the noise distribution, or noise value, for one or more blocks may be based upon a single noise value calculated after a single read operation associated with the corresponding block of memory cells 210. In another example, the noise distribution for one or more blocks may be an average (e.g., mean, median, etc.) of noise values taken over a pre-determined number of successful read operations for each corresponding block of memory cells 210. In yet another example, the noise distribution for one or more blocks of memory cells 210 may be the highest noise value determined over a pre-determined number of successful read operations. It is contemplated that in another example, a noise distribution may be generated for each block within the memory array 102 upon an initial successful read operation (or a plurality of successful read operations) of the corresponding block of memory cells 210 (e.g., the noise distribution for each block is determined after a, or a plurality of, successful read operations associated with the corresponding block of memory cells 210).

As described above, the collaborative filtering module 306 is configured to generate the noise probability distribution for one or more blocks (e.g., word lines 206) of memory cells 210 based upon previous successful reads of the memory cells 210. In an implementation, the collaborative filtering module 306 is configured to allow the data signals from the memory array 104 to pass through (e.g., without noise compensation) to the read/write channel 302 during one or more initial read cycles. In this implementation, the read/write channel 302 is configured to determine (e.g., detect) an approximate noise value associated with the respective word line 206(M) during a successful read operation. For instance, data signals representing values stored within a first block of memory cells 210 may be furnished (e.g., transmitted) through the module 306 to the read/write channel 302 during an initial (e.g., a first) read operation, or cycle. Once the read/write channel 302 determines a successful read operation has occurred (e.g., utilizing an error detection code, such as a cyclic redundancy check (CRC) code, etc.) within the selected block of memory cells 210, the read/write channel 302 is configured to determine (e.g., predict, generate, detect, etc.) a noise value (a noise distribution) associated with the first block of memory cells 210. The noise associated with each block of memory cells 210 may include, but is not limited to: random-telegraph noise, retention process noise, inter-cell interference noise, background pattern noise, read/program disturbance noise, and the like. Once the read/write channel 302 has determined the noise distribution associated with the first block of memory cells 210, the read/write channel 302 provides (e.g., transmits, furnishes, etc.) the noise distribution for the respective block of memory cells 210 to the collaborative filtering module 306 via a noise distribution feedback network 316. In an implementation, the noise distribution feedback network 316 is directly connected to the collaborative filtering module 306 via a communication interface.

The collaborative filtering module 306 is configured to store the noise distribution associated with the corresponding block of memory cells 210. In an implementation, the collaborative filtering module 306 may store the noise distribution and a corresponding block identifier via a suitable indexing operation. For example, the module 306 may store the noise distribution, with the corresponding block identifier, to allow the module 306 to retrieve the noise distribution when the corresponding block is accessed in later read operations. When the block of memory cells 210 is accessed in later read operations, the collaborative filtering module 306 is configured to retrieve the stored noise distribution value corresponding to the accessed block (e.g., word line 206) to generate a noise prediction value utilized to modify the output of the memory array 104. Thus, the collaborative filtering module 306 can retrieve the stored noise distribution value for the corresponding accessed block of memory cells 210 and generate a noise prediction based upon the retrieved noise distribution. The module 306 is then configured to compensate (e.g., modify, pre-process, etc.) the signal representing the stored memory cell 210 data value. For example, the module 306 may be configured to modify the signal representing the threshold voltages utilizing the generated noise prediction value such that at least substantially all of the noise is removed from the signal (e.g., de-noise the signal) representing the threshold voltages. After the module 306 modifies the signal, the modified signal is provided (e.g., passed) to the read/write channel 302.

Figure 4:
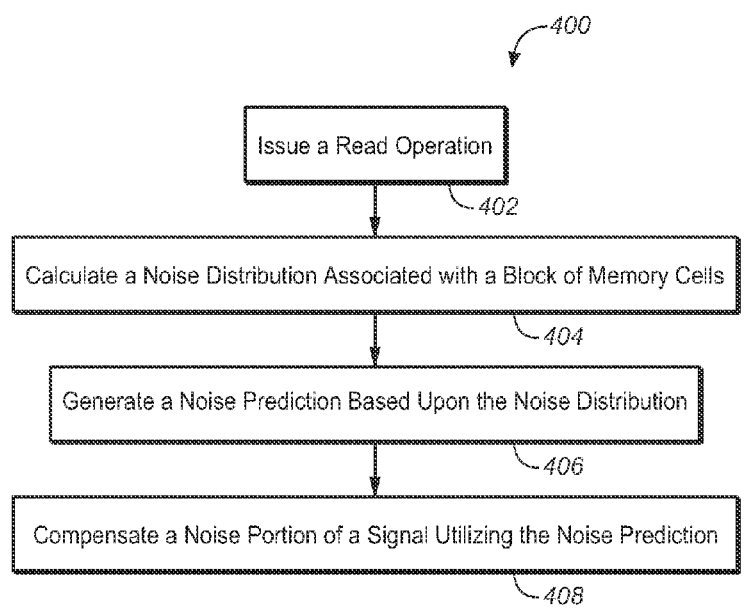
FIG. 4 is a method diagram for modifying a signal to at least substantially remove a noise portion of the signal in accordance with the present disclosure.

FIG. 4 depicts a method 400 in an example implementation in which a noise prediction is generated based upon one or more previous successful read operations. As shown, a read operation is issued to read a block of memory cells (Block 402). For example, a controller issues a first read operation (e.g., row address, column address) for a block of memory cells, such as the memory cells 210 described above. The corresponding block of memory cells is accessed in response to a read operation. In accessing the block (e.g., word line) of memory cells, a memory device returns analog signals indicative of the threshold voltages of the memory cells within the block.

If the read operation is an initial read operation, the analog signals are passed through a collaborative filtering module to a read channel configured to convert the signals to a suitable data stream. Additionally, the read/write channel is configured to determine the noise associated with the block of memory cells. For example, the read/write channel is configured to determine a noise value (e.g., noise distribution) associated with at least substantially every word line during an initial successful read operation of the respective word line. As shown in FIG. 4, a noise distribution associated with a block of memory cells is calculated (Block 404). For example, as described above, upon a successful read operation (e.g., after the first successful read operation), or multiple successful read operations, the collaborative filtering module (e.g., such as the collaborating module 306 shown in FIG. 3) is configured to calculate (e.g., generate) a noise distribution (e.g., noise value representing at least approximately the noise calculated) for the corresponding block of memory cells.

A noise prediction is generated based upon the noise distribution (Block 406). In an implementation, the collaborative filtering module is configured to generate a noise prediction (e.g., signal) that represents at least approximately the determined noise prediction from Block 404 for the corresponding block of memory cells. For example, the controller is configured to issue a subsequent read operation for a first block of memory cells. Based upon the addressing from the controller, the collaborative filtering module retrieves the noise distribution for the corresponding addressed block of memory cells.

As shown in FIG. 4, a noise portion of a signal indicative of (representing) the threshold voltage of the memory cells within the addressed block is compensated utilizing the noise prediction (Block 408). Once the addressed block of memory cells is accessed, one or more signals indicative of the threshold voltage within the memory cells are furnished to the respective bit line. The signals are then furnished to the collaborating filter module, which is configured to modify the signals based upon the noise prediction value. For example, the collaborating filter module may modify the signals to at least substantially remove the noise. The modified signal may then be furnished to the read channel for further processing, or the like.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
a collaborative filtering circuit configured to communicatively couple to a memory array, the memory array having a plurality of memory cell blocks and configured to furnish a signal representative of data stored within the plurality of memory cell blocks,
wherein the collaborative filtering circuit is configured to determine a noise distribution associated with the plurality of memory cell blocks and to generate a noise prediction when a read operation for the plurality of memory cell blocks is issued, the noise prediction based upon the noise distribution.

2. The apparatus as recited in claim 1, wherein the collaborative filtering circuit is configured to compensate the signal utilizing the noise prediction.

3. The apparatus as recited in claim 2, wherein the collaborative filtering circuit is configured to modify the signal to at least substantially remove noise from the signal.

4. The apparatus as recited in claim 2, wherein the noise comprises at least one of a random-telegraph noise, a retention process noise, an inter-cell interference noise, a background pattern noise, or a read/program disturbance noise.

5. The apparatus as recited in claim 1, wherein the plurality of memory cell blocks comprise a plurality of non-volatile memory cell blocks.

6. The apparatus as recited in claim 5, wherein the plurality of non-volatile memory cell blocks comprise a plurality of NAND memory cell blocks.

7. The apparatus as recited in claim 6, wherein the plurality of NAND memory cell blocks comprise a plurality of NAND multi-level memory cell blocks, each NAND multi-level memory cell within the plurality of NAND multi-level memory cell blocks configured to store more than a single bit of data.

8. A storage device comprising:
a memory array having a plurality of memory cell blocks, the memory array configured to furnish a signal representative of data stored within the plurality of memory cell blocks;
a read/write channel configured to determine a noise value associated with a first memory cell block of the plurality of memory cell blocks during a first read operation; and
a collaborative filtering module communicatively coupled to the memory array and the read/write channel, the collaborative filtering module configured to receive the noise value from the read/write channel to determine a noise distribution associated with the first memory cell block of the plurality of memory cell blocks and to generate a noise prediction when a second read operation for the first memory cell block of the plurality of memory cell blocks is issued, the noise prediction based upon the noise distribution.

9. The storage device as recited in claim 8, wherein the collaborative filtering module is configured to compensate the signal utilizing the noise prediction.

10. The storage device as recited in claim 9, wherein the collaborative filtering module is configured to modify the signal to at least substantially remove noise from the signal.

11. The storage device as recited in claim 9, wherein the noise comprises at least one of a random-telegraph noise, a retention process noise, an inter-cell interference noise, a background pattern noise, or a read/program disturbance noise.

12. The storage device as recited in claim 8, wherein the plurality of memory cell blocks comprise a plurality of non-volatile memory cell blocks.

13. The storage device as recited in claim 12, wherein the plurality of non-volatile memory cell blocks comprise a plurality of NAND memory cell blocks.

14. The storage device as recited in claim 13, wherein the plurality of NAND memory cell blocks comprise a plurality of NAND multi-level memory cell blocks, each NAND multi-level memory cell within the plurality of NAND multi-level memory cell blocks configured to store more than a single bit of data.

15. A method comprising:
calculating a noise distribution associated with a first block of memory cells of an array of memory cells after an issuance of a first read operation to the first block of memory cells;
generating a noise prediction based upon the noise distribution when a second read operation to the first block of memory cells is issued, the noise prediction generated by a collaborative filtering module; and
compensating a noise portion of a signal utilizing the noise prediction.

16. The method as recited in claim 15, wherein the signal represents data stored within the first block of memory cells.

17. The method as recited in claim 15, wherein compensating the noise portion further comprises modifying a signal to at least substantially remove a noise portion from the signal.

18. The method as recited in claim 15, wherein the first block of memory cells comprises a first block of non-volatile memory cells.

19. The method as recited in claim 18, wherein the first block of non-volatile memory cells comprises a first block of NAND memory cells.

20. The method as recited in claim 15, wherein the noise portion comprises at least one of a random-telegraph noise portion, a retention process noise portion, an inter-cell interference noise portion, a background pattern noise portion, or a read/program disturbance noise portion.

* * * * *